(12) United States Patent
Zenz

(10) Patent No.: US 10,366,320 B2
(45) Date of Patent: Jul. 30, 2019

(54) DUAL-INTERFACE IC CARD

(71) Applicant: NXP B.V., Eindhoven (NL)

(72) Inventor: Christian Zenz, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/331,739

(22) Filed: Oct. 21, 2016

(65) Prior Publication Data

US 2017/0140257 A1 May 18, 2017

(30) Foreign Application Priority Data

Oct. 21, 2015 (EP) .................................... 15190726

(51) Int. Cl.
*G06K 19/06* (2006.01)
*G06K 19/077* (2006.01)
*H01L 21/48* (2006.01)
*H01L 23/498* (2006.01)
(Continued)

(52) U.S. Cl.
CPC . *G06K 19/07754* (2013.01); *G06K 19/07769* (2013.01); *H01L 21/4853* (2013.01); *H01L 23/49838* (2013.01); *H01L 23/49855* (2013.01); *H01L 23/66* (2013.01); *H01L 24/48* (2013.01); *H01L 2223/6611* (2013.01); *H01L 2223/6677* (2013.01); *H01L 2224/48227* (2013.01); *H01L 2224/85444* (2013.01);
(Continued)

(58) Field of Classification Search
CPC ......... G06K 19/07749; G06K 19/0775; G06Q 20/341
USPC .................................... 235/492, 487, 472.02
See application file for complete search history.

(56) References Cited

U.S. PATENT DOCUMENTS 5,671,525 A * 9/1997 Fidalgo ............ G06K 19/07749
235/488
9,424,507 B2 8/2016 Zenz et al.
9,536,188 B2 1/2017 Schoengrundner et al.
(Continued)

OTHER PUBLICATIONS

Extended European Search Report for Patent Appln. No. 15190726.8 (dated Apr. 11, 2016).

*Primary Examiner* — Daniel S T Cyr

(57) ABSTRACT

The disclosure relates to a dual-interface integrated circuit (IC) card. Embodiments disclosed include a dual-interface card (100) comprising: a card body (122) containing an antenna (120), the antenna having first and second antenna connections; and a dual-interface integrated circuit card module (150) comprising: a substrate (104) having first and second opposing surfaces; a contact area (102) on the first surface of the substrate (104), the contact area (102) comprising a plurality of contact pads (108) and first and second routing connections (106) each having a first end and a second end; an integrated circuit (110) on the second surface of the substrate (104); electrical connections through the substrate (104) connecting the integrated circuit (110) to the plurality of contact pads (108) and to the first end of each of the first and second routing connections (106); and first and second antenna connectors (118) disposed in respective first and second holes (103) in the substrate (104) and in electrical contact with the second end of the respective first and second routing connections, wherein the first and second antenna connectors (118) of the card module are electrically connected to the first and second antenna connections of the card body (122).

13 Claims, 10 Drawing Sheets

(51) Int. Cl.
*H01L 23/66* (2006.01)
*H01L 23/00* (2006.01)

(52) U.S. Cl.
CPC .............. *H01L 2224/85447* (2013.01); *H01L 2224/85455* (2013.01); *H01L 2924/00014* (2013.01)

(56) References Cited

U.S. PATENT DOCUMENTS

| | | | |
|---|---|---|---|
| 2002/0170974 A1* | 11/2002 | Kashima | G06K 19/005 235/492 |
| 2003/0024996 A1 | 2/2003 | Muehlberger et al. | |
| 2006/0139901 A1* | 6/2006 | Meireles | G06K 19/07745 361/760 |
| 2010/0176215 A1* | 7/2010 | Fulkerson | B05B 7/1404 239/112 |
| 2013/0134227 A1* | 5/2013 | De Maquille | G06K 19/07722 235/492 |
| 2013/0146670 A1 | 6/2013 | Grieshofer et al. | |
| 2014/0152511 A1* | 6/2014 | Merlin | G06K 19/077 343/700 MS |
| 2015/0129665 A1 | 5/2015 | Finn et al. | |
| 2015/0294213 A1 | 10/2015 | Ziemkus | |
| 2017/0092612 A1 | 3/2017 | Zenz | |

* cited by examiner

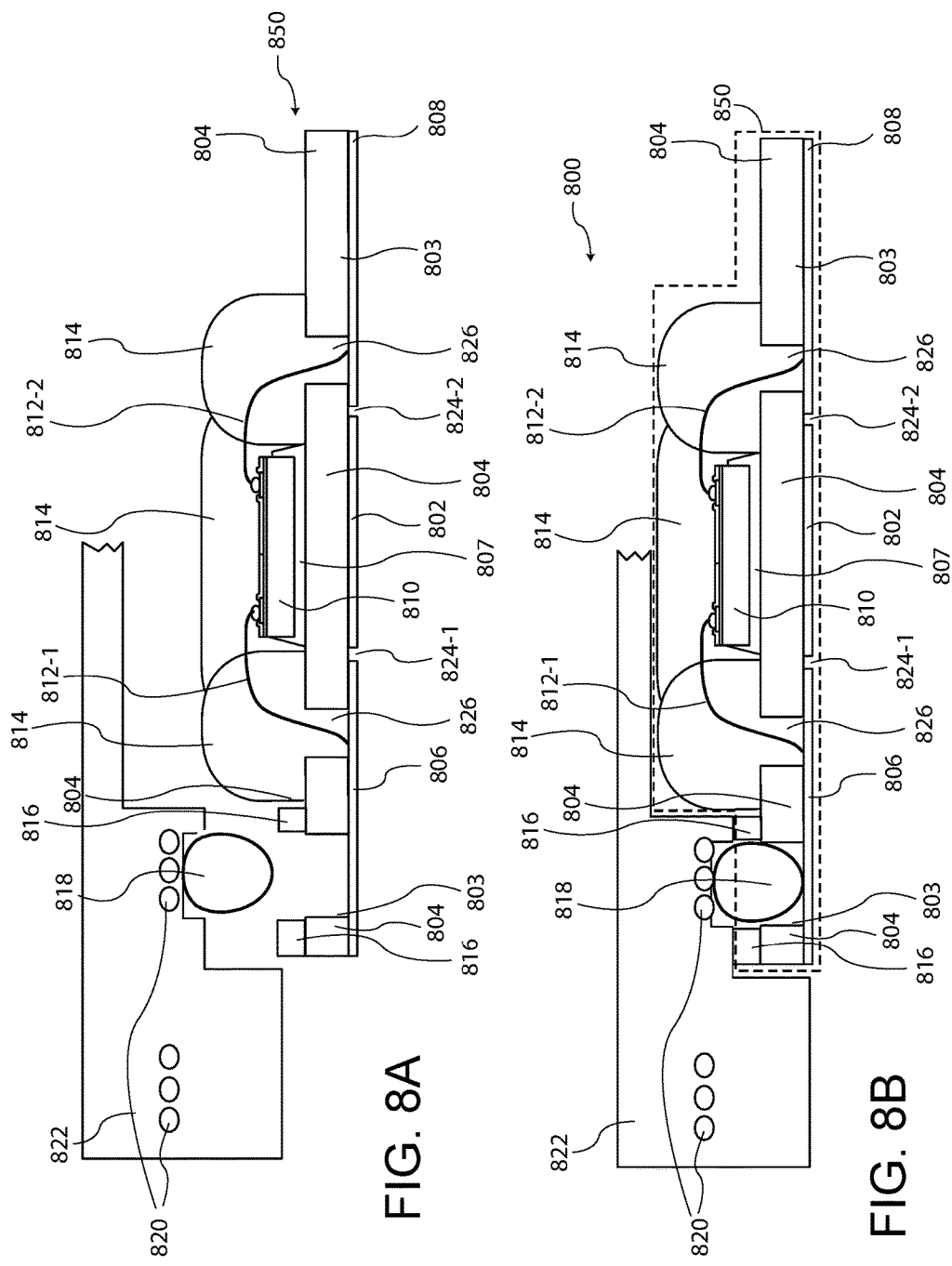

DUAL-INTERFACE IC CARD

CROSS-REFERENCE TO RELATED APPLICATIONS

This application claims the priority under 35 U.S.C. § 119 of European patent application no. 15190726.8, filed on Oct. 21, 2015, the contents of which are incorporated by reference herein.

FIELD

The disclosure relates to a dual-interface integrated circuit (IC) card.

BACKGROUND

An IC card, commonly known as a smart card, includes an embedded IC that can be used to store information and perform data processing. For example, such cards can be used in financial, transportation, security, healthcare and other applications to provide identification and authentication. Types of IC cards include contact IC cards that communicate via electrical contacts, contactless IC cards that communicate wirelessly through antennas, and dual-interface IC cards that can communicate via electrical contacts and wirelessly through an antenna, also embedded in the card.

A typical dual-interface IC card comprises a module containing the IC chip and electrical contacts. Such a module may be embedded into a card body. The card body may contain a secondary antenna inductively coupled to a primary antenna on the module, or may contain an antenna to be electrically connected to the IC chip.

Compared to contact IC cards and contactless IC cards, dual-interface IC cards allow users to switch between contact card readers and contactless card readers. However, since dual-interface IC cards include both electrical contacts and antennas, such cards are more expensive to manufacture.

SUMMARY

According to a first aspect of the present disclosure there is provided a dual-interface card comprising:

a card body containing an antenna, the antenna having first and second antenna connections; and a dual-interface integrated circuit card module comprising:

a substrate having first and second opposing surfaces;

a contact area on the first surface of the substrate, the contact area comprising a plurality of contact pads and first and second routing connections each having a first end and a second end;

an integrated circuit on the second surface of the substrate;

electrical connections through the substrate connecting the integrated circuit to the plurality of contact pads and to the first end of each of the first and second routing connections; and first and second antenna connectors disposed in respective first and second holes in the substrate and in electrical contact with the second end of the respective first and second routing connections, wherein the first and second antenna connectors of the card module are electrically connected to the first and second antenna connections of the card body.

Such a card may be more cost-effective than dual interface cards currently available on the market. In current dual interface cards, a prefabricated double-sided contact base structure, such as double sided tape, is typically used to provide a substrate with a contact area comprising contact pads on both sides of the substrate. The contact pads may be etched or stamped to provide front side reader contacts and back side antenna contacts. A card according to the first aspect may be manufactured from single sided tape, since etched contacts for the antenna are not required on the back side, thereby reducing the costs of manufacturing for a dual interface card module.

As an additional advantage, in a card according to the first aspect the depth between the integrated circuit and the routing connection is maximised, allowing longer bond wires to be used to connect the routing connection to the IC. Longer bond wires may be less susceptible to break when the card is subjected to bending. In addition, bond wires connecting the routing connections to the IC are covered by a thicker layer of encapsulation, thus increasing the mechanical reliability.

In some embodiments, the antenna connectors may comprise solder and/or a conductive adhesive. The module may further comprise a metal plug or plugs placed across one of, or both, the holes on the second surface of the substrate. In some embodiments, the antenna connector may comprise a metal plug or stud bump.

In some embodiments, the first or second routing connection may comprise one of the plurality of contact pads. For example, the contact pads may be arranged in accordance with the ISO 7816 standard for IC card contact areas, and the first or second routing connection may comprise an ISO contact pad that is not required for wired communication with a card reader. Alternatively, the first or second routing connections may form an electrical path around or between the contact pads, for example an ISO 7816 standard contact pad.

In some embodiments, the antenna connectors may form a mechanical bond between the card module and the card body. Alternatively or additionally, an adhesive may be used to attach the module to the card body. For example, a holt melt adhesive may be used.

In some embodiments, the card may further comprise a supplementary connection between each antenna connection of the card body and antenna connector of the card module. For example the supplementary connection may comprise a wire connected between the antenna connector of the card module and the antenna connection of the card body.

According to a second aspect of the present disclosure there is provided a method of manufacturing a dual-interface card, the method comprising:

providing a card body containing an antenna, the antenna having first and second antenna connections;

providing a substrate having first and second opposing surfaces, a contact area on the first surface of the substrate comprising a plurality of contact pads and first and second routing connections each having a first end and a second end;

forming a plurality of holes through the substrate;

disposing an antenna connector into first and second ones of the plurality of holes, each antenna connector being in electrical contact with the second end of one of the routing connections;

disposing an integrated circuit on the second surface of the substrate;

forming electrical connections through the holes in the substrate to connect the integrated circuit to the plurality of contact pads and to the first end of each of the first and second routing connections; and attaching the module to the card body, forming electrical connections between the antenna connections on the card body and the antenna connectors on the module.

In some embodiments, placing an antenna connector into each of the first and second holes may comprise placing a pre-formed ball of solder into the first and second holes, and reflowing the balls of solder while or before attaching the module to the card body.

In some embodiments, the antenna connectors may comprise solder or a conductive adhesive, and the method may further comprise:

disposing metal plugs in each of the first and second holes; and reflowing the solder or curing the conductive adhesive within the holes while attaching the module to the card body.

BRIEF DESCRIPTION OF DRAWINGS

Embodiments will be described, by way of example only, with reference to the drawings, in which

FIG. 8A illustrates a first step in a process that can be used to produce an alternative embodiment of a dual-interface IC card;

FIG. 8B illustrates a second step in a process that can be used to produce an alternative embodiment of a dual-interface IC card;

Figure 1:
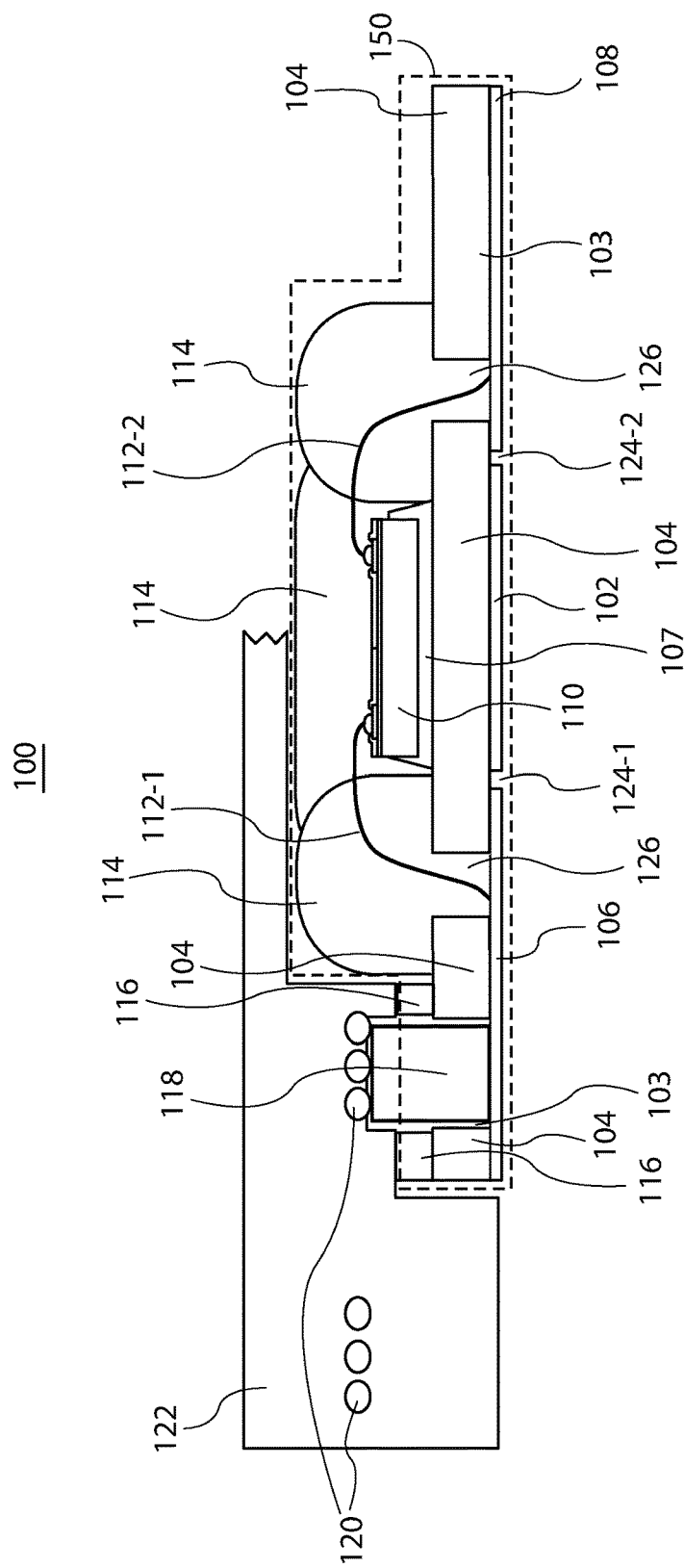
FIG. 1 illustrates a cross-sectional view of an example embodiment of a dual-interface IC card.

It should be noted that the figures are diagrammatic and not drawn to scale. Relative dimensions and proportions of parts of these figures have been shown exaggerated or reduced in size, for the sake of clarity and convenience in the drawings. Similar reference signs are generally used to refer to corresponding or similar feature in modified and different embodiments.

DETAILED DESCRIPTION OF EMBODIMENTS

FIG. 1 is a cross-sectional view of an example embodiment of a dual-interface IC card 100. The dual-interface IC card 100 can be used in financial, transportation, security, healthcare, or other applications to store information and perform data processing. In some embodiments, the dual-interface IC card 100 has the ability to securely manage, store and provide access to data on the card, perform on-card functions, such as encryption, authentication, and authorization, and interact with a card reader. The dual-interface IC card 100 can communicate by electrical contacts or wirelessly through an antenna. In an embodiment, the dual-interface IC card 100 is a smart card, which can be used in near field communication (NFC) applications. In some embodiments, the card 100 is a smart card that is designed to be compatible with the international standard ISO/IEC 14443 for identification cards. The manufacturing cost of the dual-interface IC card 100 can be significantly lower than conventional dual-interface IC cards because the dual-interface IC card 100 can be produced using a prefabricated single-sided contact base structure that is used to make a module for a contact smart card (e.g., a standard single-sided contact tape currently available in the marketplace), rather than a more expensive prefabricated double-sided contact base structure that is used to make a module for a dual-interface smart card (e.g., a standard double-sided contact tape currently available in the market).

In the embodiment depicted in FIG. 1, the dual-interface IC card 100 includes a contact area 102 on a first surface of a substrate 104, the contact area 102 including a routing connection 106 and a contact pad 108; an IC 110; bond wires 112-1, 112-2; an encapsulation 114, adhesive 116, antenna connector 118, an antenna 120, and a card body 122. The antenna connector 118 is disposed in a hole 103 in the substrate 104. Although only one routing connection 106, hole 103 and antenna connector 118 are shown in FIG. 1, the card 100 comprises first and second routing connections, holes and antenna connectors, the first and second antenna connectors being electrically connected to respective first and second antenna connections on the card body 122.

The contact area 102, the substrate 104, the IC chip 110, the bond wires 112, the encapsulation 114, and the antenna connector 118 form a dual-interface IC module 150. IC module 150 may be manufactured separately to the card body 122, and subsequently attached to the card body 122 during a final assembly process. For example, a device manufacturer can produce dual-interface IC modules in mass quantities based on prefabricated single-sided contact base structures, such as prefabricated single-sided contact tapes provided by Linxens, Interplex, Kinsus, LG Innotek and Possehl.

Although the dual-interface IC card 100 is shown in FIG. 1 as including certain components, in other embodiments the dual-interface IC card 100 may include additional components that are commonly found in conventional dual-interface smart cards.

The contact area 102 of the dual-interface IC card module 150 comprises a plurality of contact pads 108 used to make electrical contacts for the IC 110 to communicate with a card reader. The contact area 102 is located on an external front side of the dual-interface IC card while the card body 122 provides the back side of the card 100. The contact area 102 may be made of metal, for example a Gold (Au)-Nickel (Ni) plated Copper (Cu) foil or electroplated copper. The contact area 102 provides electrical connectivity when the dual-interface IC card 100 is inserted into a compatible card reader. In some embodiments, the contact pad 102 is designed and produced to be compatible with the international standard ISO/IEC 7816 for electronic identification cards with contacts. The contact area 102 typically includes groove/recess lines used to electrically insulate the plurality of contact pads 108 from each other, as well as from routing connections 106, and to make the contact area 102 more flexible. In the embodiment depicted in FIG. 1, the contact area 102 has two groove lines 124-1, 124-2. However, in other embodiments, the contact pad may have any number of groove lines. The contact area 102 may be prepared by any suitable known method. For example, the contact area 102 may be formed by selective etching of a metal layer on a substrate, such as single-sided contact tape.

The substrate 104 is used to support other elements of the dual-interface IC card 100, including the contact area 102 and the IC 110. The substrate 104 may be made of any suitable substrate material. As an example, the substrate 104 may be made of epoxy glass, fiberglass, or plastic substrates (polyethylene naphthalate (PEN), etc.). In the embodiment depicted in FIG. 1, through holes 126 are provided in the substrate 104 to enable wire bonds to be made between the IC 110 and the contact area 102. The substrate 104 may be in the form of a sheet or a tape. In some embodiments, the contact area 102 and the substrate 104 form a single-sided contact base structure, which may be packaged into a single-sided contact tape. For example, a device manufacturer may produce a prefabricated single-sided contact base structure that includes the contact area 102 and the substrate 104 (with through holes) in mass quantities. In some embodiments, an optional adhesive layer (not shown) may be located between the contact area 102 and the substrate 104.

The substrate 104 further comprises a hole 103 in which an antenna connector 118 is disposed. Hole 103 may be formed in the substrate 104 for example by punching, drilling or milling the substrate 104 from the second surface of the substrate 104 preferably during the same processing step as forming the bonding holes 126. The hole 103 exposes the underside of the contact area 102, and in particular exposes part of the routing connection 106. The antenna connector 118 is in electrical contact with the routing connection 106, and may be supported by the routing connection 106 or contact pad 102 generally. Alternatively, the antenna connector 118 may be attached to and supported by the substrate 104. The antenna connector 118 may, for example, comprise solder, conductive adhesive, conductive elastic adhesive (known as a flex bump), or a metal plug or stud bump, as described below.

The IC 110 of the dual-interface IC card 100 includes circuitry to securely manage, store and provide access to data on the card and/or perform on-card functions, such as encryption, authentication, and authorization. The IC 110 is designed to communicate with another device (e.g., a card reader) by electrical contacts or wirelessly through the antenna 120. In the embodiment depicted in FIG. 1, the dual-interface IC card 100 includes a single IC 110 with both contact and contactless interfaces, which makes it possible to access the IC 110 using either a contact interface (i.e. the contact area 102) or a contactless interface (i.e. the antenna 120) with a high level of security. Alternatively, the dual-interface IC card 100 may include two ICs, including one IC with a contact interface and another, separate, IC with a contactless interface. The IC 110 may be attached to the substrate 104 using any appropriate method. As an example, in some embodiments, the IC 110 is glued onto the substrate 104 using an adhesive layer 107.

The bond wires 112-1, 112-2 of the dual-interface IC card 100 are used to electrically connect the IC 110 to the contact area 102 and to the antenna 120. The bond wires 112-1, 112-2 may be made of any suitable metal (e.g., Gold, aluminium or copper). In the embodiment depicted in FIG. 1, the bond wire 112-1 electrically connects the IC 110 to a first end of the routing connection 108, which is electrically connected at a second end to the antenna 120 via antenna connector 118, while the bond wire 112-2 electrically connects the IC 110 to a contact pad 108. Bond pads may be used to attach the bond wires 112-1, 112-2 to the IC 110, the contact pads 108, and/or the routing connections 106.

Encapsulation 114 is used to protect the bond wires 112-1, 112-2 and the IC 110. The encapsulation 114 may be made of a suitable material, such as epoxy, in a process such as glob-top or moulding.

Figure 2:
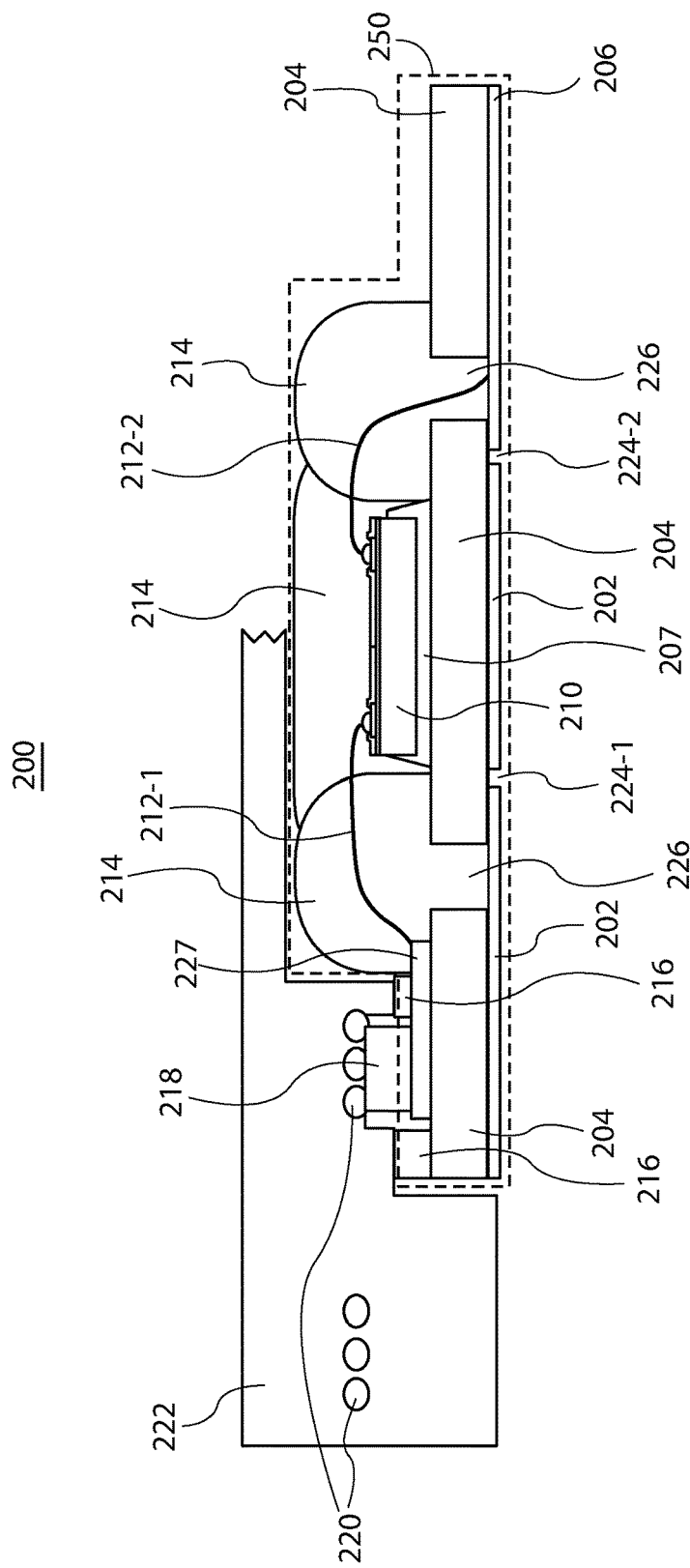
FIG. 2 illustrates a cross-sectional view of an example dual-interface IC card.

FIG. 2 shows an example of an alternative example of a dual-interface card 200 including a dual-interface IC module 250 based on a single-sided substrate 204. Common features to those in the card 100 of FIG. 1 are identified with similar reference numerals.

The IC 210 is connected to the antenna 220 via antenna pads 227 placed on the surface of the substrate 204. Bond wires 212-1 of module 250 are therefore shorter than bond wires 112-1 of module 150, as there is less distance between the antenna pads 227 and IC 210 of module 250 than the routing connection 106 and IC 110 of FIG. 1. Shorter bond wires are more likely to shear off or break when the card 200 is exposed to mechanical stress, for example when the card 200 is bent. This can result in an electrical failure. The increased depth available between the routing connections 106 and IC 110 in module 150 permits longer bond wires to be used, which are less susceptible to breaking when the module 250 is exposed to mechanical stress. In addition, the increased depth allows for more protection of the critical connection between the bond wire 112-1 and the routing connection 106 by a thicker layer of encapsulation 114. Dual-interface modules according to the present disclosure, for example the example embodiment illustrated in FIG. 1, may therefore be more resilient when under mechanical stress than the example module 250 of FIG. 2.

Figure 3:
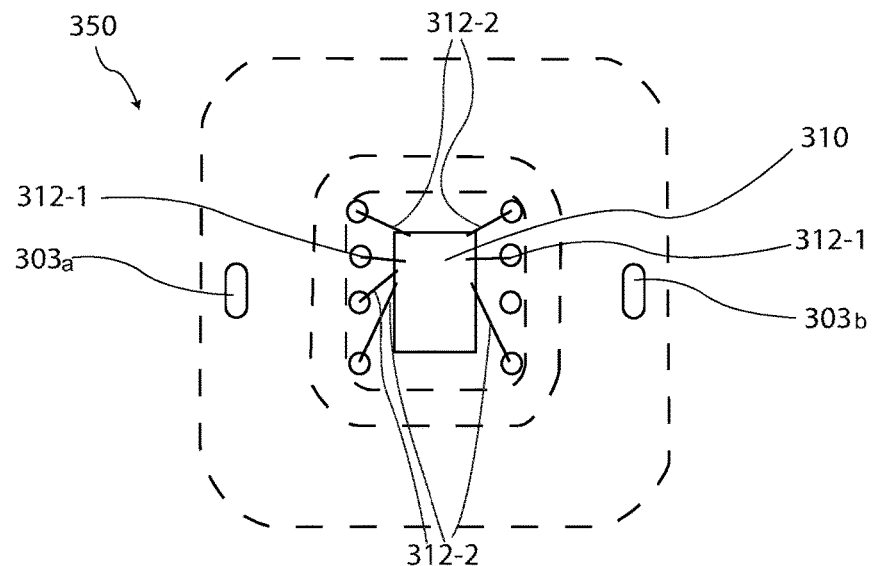
FIG. 3 illustrates a back-side plan view of the dual-interface IC chip module.

FIG. 3 depicts a back-side view of an example dual-interface module 350. Module 350 comprises an IC 310 and holes 303a and 303b. Bond wires 312-2 connect the IC 310 to the plurality of contact pads on the other surface of the substrate. Bond wires 312-1 connect the IC 310 to the routing connections on the other surface of the substrate, which are in turn connected to the holes 303a, 303b. Antenna connectors may be placed in the holes 303a, 303b to form an electrical connection between an antenna in a card body and the IC 310 via the contact area on the other surface of the substrate. The holes 303a, 303b are possible embodiments of the holes 103, or holes associated with any of the embodiments of the card described below.

Figure 4A:
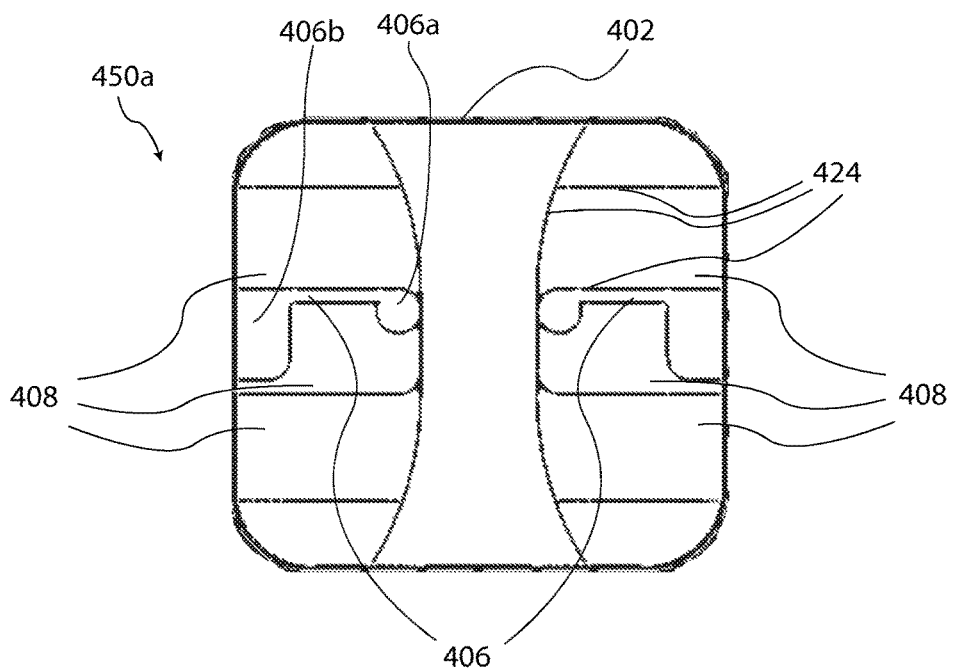
FIG. 4A illustrates a contact pad side view of an embodiment of a dual-interface IC chip module.
Figure 4B:
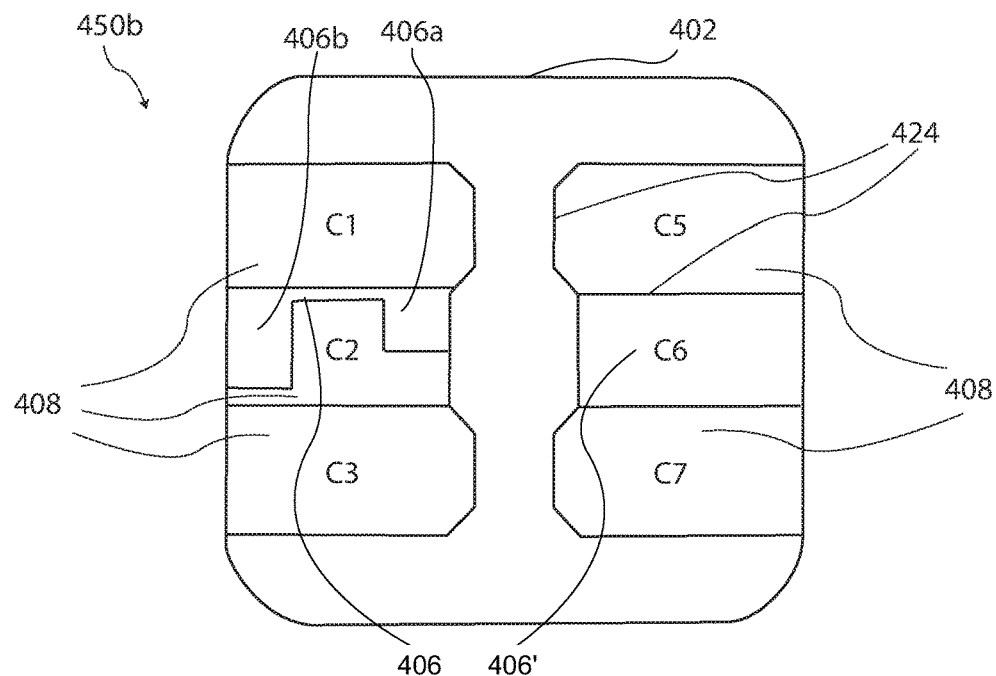
FIG. 4B illustrates a contact pad side view of an alternative embodiment of a dual-interface IC chip module.
Figure 4C:
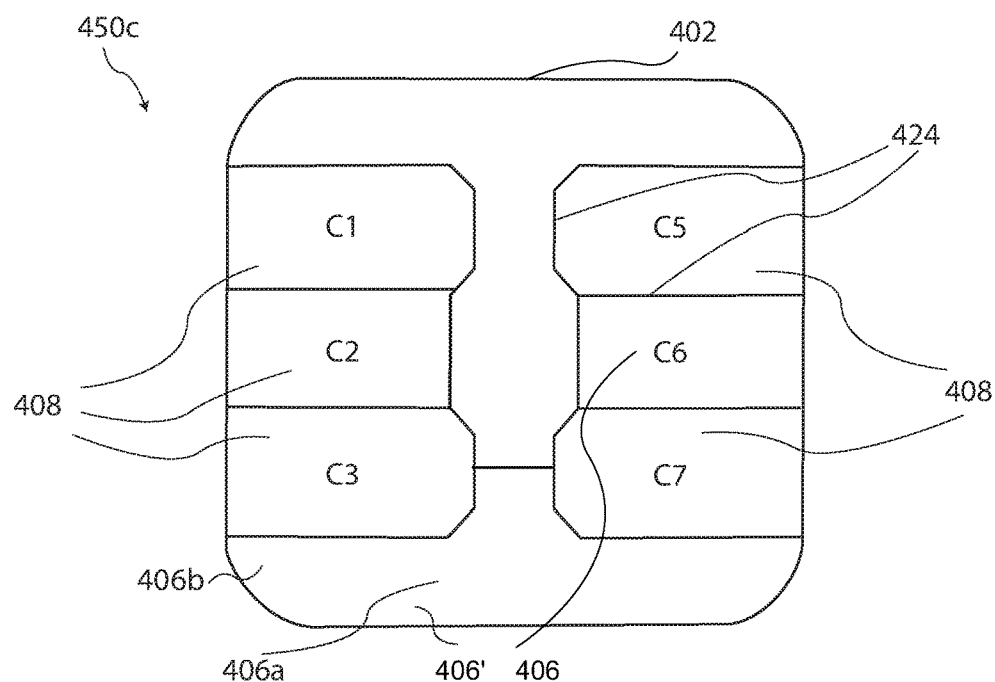
FIG. 4C illustrates a contact pad side view of an embodiment of a dual-interface IC chip module.

FIGS. 4A, 4B, and 4C depict front-side views of possible embodiments of a dual-interface IC module 450a, 450b, 450c. The features of the front-sides illustrated in FIGS. 4A, 4B, and 4C may equally apply to the embodiments of modules 150, 350, or any embodiment of the card described below.

In the example embodiment depicted in FIG. 4A, a front-side view of a dual-interface IC module 450a shows a contact area 402, which includes a plurality of contact pads 408 separated by groove lines 424 (for clarity, not all groove lines 424 are labelled in FIG. 4A). Routing connections 406 form electrical paths between contact pads 408. Each routing connection 406 comprises a first end 406a and a second end 406b, the first end 406a being closer to the IC (not shown), which is positioned centrally on the back-side of the module 450a. The first end 406a is connected to an IC for example by bond wires. The second end 406b of each routing connection 406 is connected to an antenna connector, such as antenna connector 118 (FIG. 1), which is disposed in a hole in the substrate. Routing connections 406 provide electrical connection between antenna connections on the IC to an antenna in the card body via the contact area 402.

FIG. 4B shows a front view of an alternative example embodiment of a dual-interface IC module 450b. In this example, one of the antenna connectors 406 is similar to the routing connections in module 450a, forming a path around a contact pad 408. However, the other routing connection 406' is one of the contact pads 408. For example, the contact pads may be arranged to conform to the ISO 7816 standard. This standard provides for six contact pads 408, labelled as C1, C2, C3, C5, C6, and C7 in FIG. 4B. Contact pad C6 is not required for wired contact to a card reader, so is available for use as a routing connection.

FIG. 4C shows a front side view of an alternative embodiment of an IC module 450c. In this embodiment, as in module 450b, one the contact pads 408 is used as a first routing connection 406—for example pad C6 in the ISO 7816 standard. The other routing connection 406' is formed from a part of the contact area 402 that is not required for wired connections to a card reader—for example that is not part of the defined contact pads according to the ISO 7816 standard. This embodiment may be advantageous, as the design of the contact area 102 may not significantly differ from the design of normal wired IC card, or dual-interface card as currently available on the market.

In both FIGS. 4B and 4C, each routing connection 406, 406' comprises a first end, 406a, and a second end, 406b. The first end 406a is connected to an IC on the other side of the module 450b, 450c, for example by bond wires connections. The second end 406b is connected to an antenna connector disposed in a hole in the substrate. Routing connections 406 provide an electrical connection from antenna pins on the IC to an antenna in a card body via the contact area 402.

Figure 5:
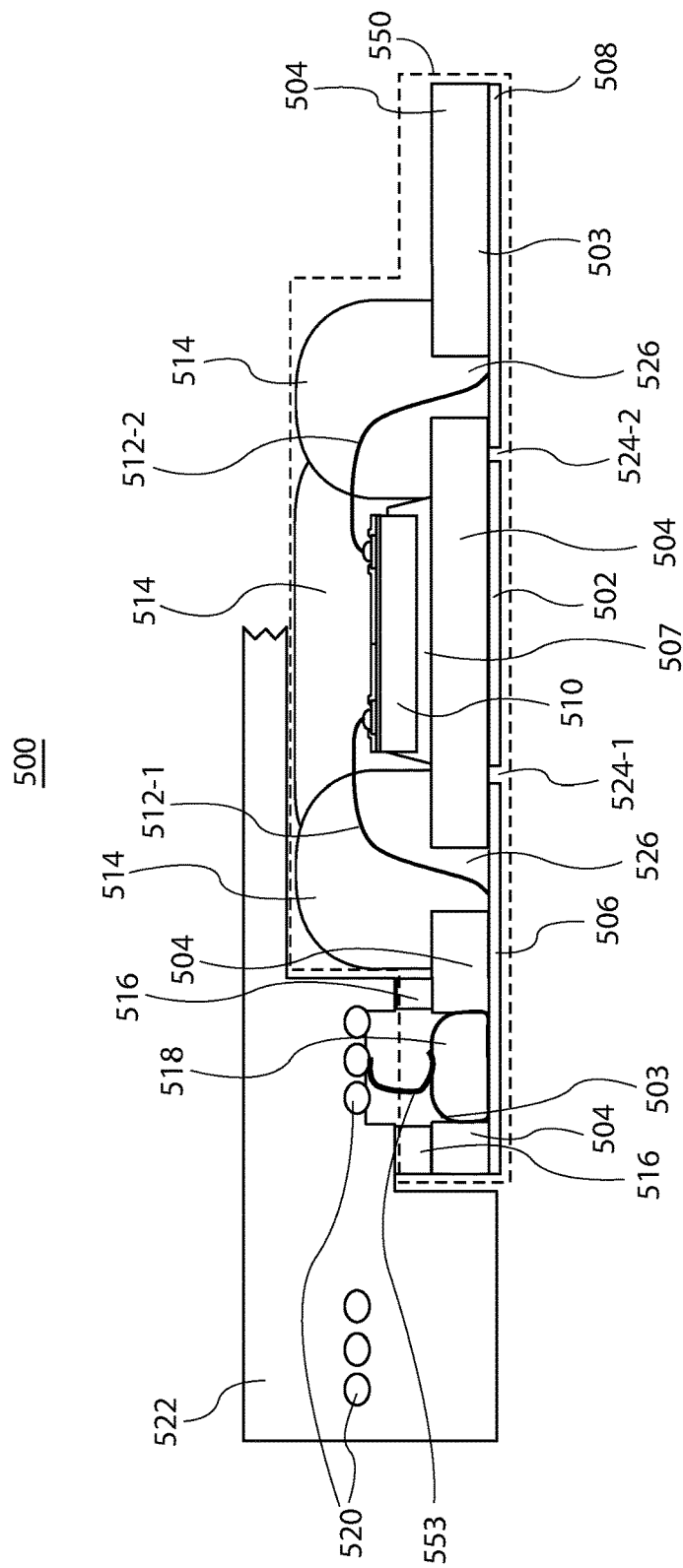
FIG. 5 illustrates a cross-sectional view of a dual-interface IC card in accordance with an alternative example embodiment.

FIGS. 5, 7, 8, and 9 illustrate alternative example embodiments of a dual-interface card, illustrating possible antenna connectors. These figures show a cross-section taken through the modules, and only show a single routing connection, hole, and antenna connector. Reference signs in FIG. 5 are similar to those indicated above with reference to FIGS. 1 and 2, with the first digit changed accordingly. All of the depicted embodiments comprise a further, unillustrated, routing connection, hole, and antenna connector. Any of the embodiments of the front side of the module depicted in FIGS. 4A-C, or any other embodiment, may be used with the embodiments of FIGS. 5, 7, 8, and 9.

FIG. 5 illustrates an example embodiment of a dual-interface card 500, comprising an antenna connector 518 formed from solder. This embodiment further comprises a supplementary connection 553 between the antenna 520 and antenna connector 518. This may be necessary in embodiments where the antenna connector 518, for example in the form of a solder ball, does not extend out of the hole 503 far enough to physically connect with the antenna 520. Such a supplementary connector may be used in any other embodiment of a dual interface card according to the present disclosure. In the illustrated embodiment, the supplementary connection 553 comprises a wire extending from the antenna 520 to the antenna connector 518.

FIG. 6 illustrates step by step a process by which an example substrate may be formed for connecting an IC to. At a first step, shown in FIG. 6A, a single-sided substrate 504 is provided, having contact pads 508 and routing connections 506 on a first face and holes 503, 526 provided through the substrate 504.

Figure 6A:
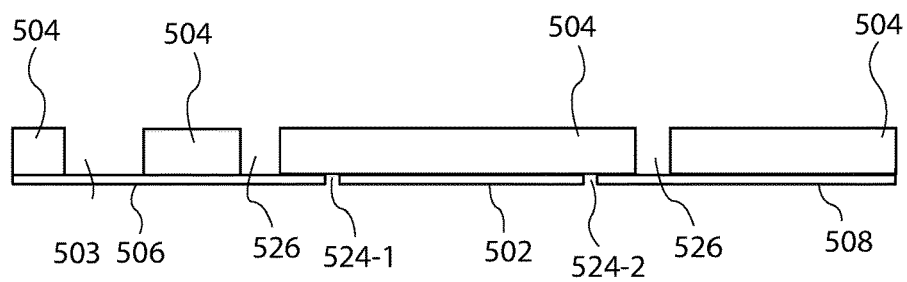
FIG. 6A illustrates a first step of a process that can be used to produce the embodiment shown in FIG. 5.
Figure 6B:
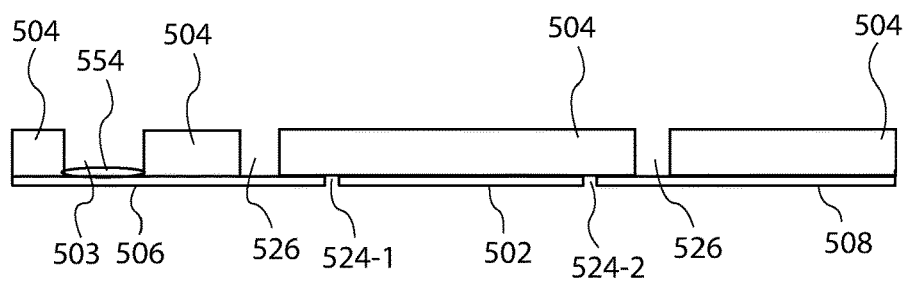
FIG. 6B illustrates a second step of a process that can be used to produce the embodiment shown in FIG. 5.

As a second step, depicted in FIG. 6B, flux 554 is applied into a hole 503. The flux 554 may act as a wetting agent between the routing connection 506 and a subsequent solder antenna connector 518.

Figure 6C:
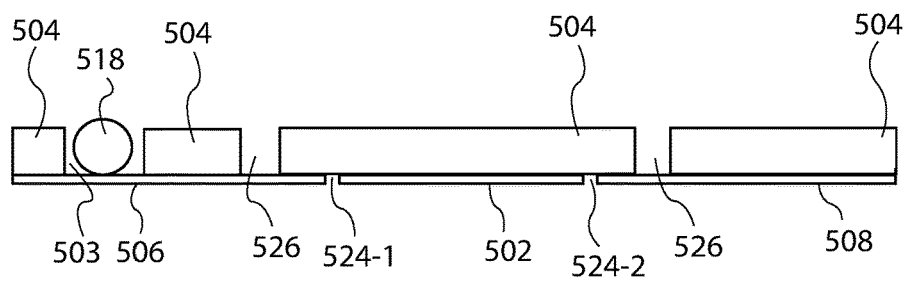
FIG. 6C illustrates a third step of a process that can be used to produce the embodiment shown in FIG. 5.
Figure 6D:
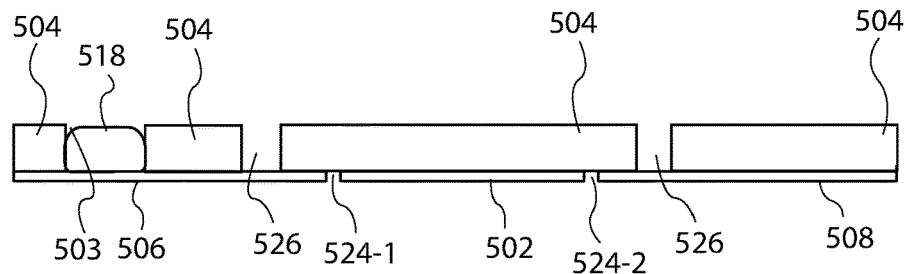
FIG. 6D illustrates a fourth step of a process that can be used to produce the embodiment shown in FIG. 5.

As a third step, as depicted in FIG. 6C, a ball of solder 518 is placed into the hole 503. The balls of solder 518 may for example be pre-formed balls of solder, or solder paste. At the fourth step, shown in FIG. 6D, heat is applied to reflow the solder 518, so that the ball of solder fills hole 503 to form an antenna connector 518. Finally the antenna connector 518 is connected an antenna 520 in a card body 522, via the supplementary connector 553, to form the card 500, as shown in FIG. 5. The module 550 and card body 522 may be physically connected by applying a hot melt adhesive 516 between the module 550 and card body 522. In alternative embodiments, the antenna connector 518 may be soldered directly onto the antenna 520, rather than using supplementary connector 553.

Figure 7A:
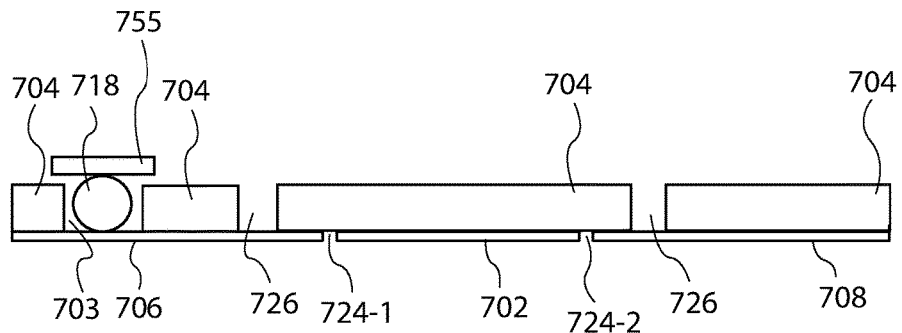
FIG. 7A illustrates a first step in a process that can be used to produce an alternative embodiment of a dual-interface IC card.
Figure 7B:
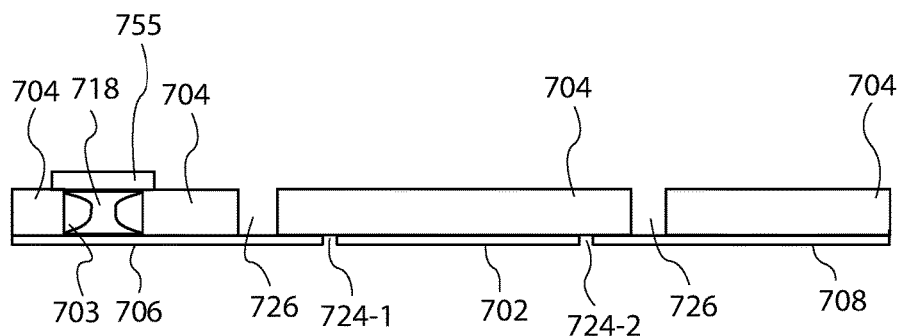
FIG. 7B illustrates a second step in a process that can be used to produce an alternative embodiment of a dual-interface IC card.

FIG. 7 illustrates a process for making a substrate with an alternative solder antenna connector 718. The process begins with the first three steps as described above in relation to FIGS. 6A-C. However, before reflowing the solder, a metal plug 755 is placed across the hole 703, as shown in FIG. 7A. The solder is then reflowed by applying heat, as shown in FIG. 7B. In this case, because of the presence of the metal plug 755, the solder connects only the routing connection 706 and the metal plug, without any connection to the walls of the hole 703 formed by the substrate 704. This may prevent electrical shorts in a direction through the plane of the substrate. After reflowing and connection of an IC, the resulting module is connected to a card body as described above, and the antenna connector 718 is connected to an antenna in the card body, in this case via the metal plug 755.

Figure 7C:
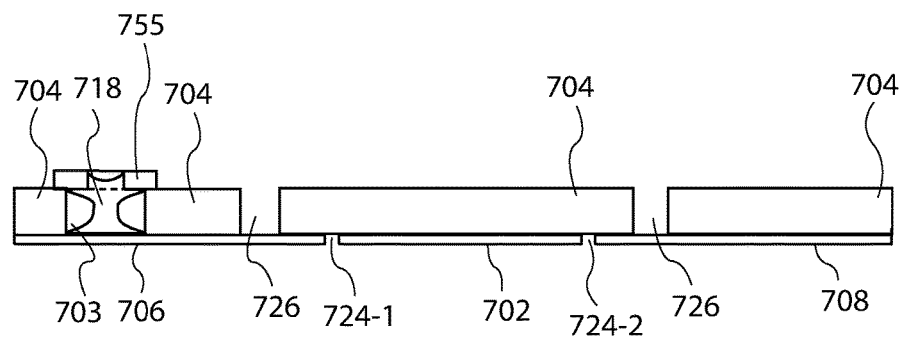
FIG. 7C illustrates a third step in a process that can be used to produce an alternative embodiment of a dual-interface IC card.

In some embodiments, the metal plug 755 may comprise a hole to improve mechanical stability. The solder of the antenna connector 718 may partially flow into the hole of the metal plug 755. Such an embodiment is shown in FIG. 7C.

In alternative embodiments using a metal plug, a conductive adhesive may be used instead of solder to form the antenna connector. For example, the conductive adhesive may be cured by a thermode, or in an oven. The curing heat may be applied, for example, from the contact area side of the module.

FIGS. 8A and 8B illustrate a process for connecting together the card body 822 and module 850 an embodiment of dual-interface IC card 800, in which the antenna connector comprises a conductive adhesive. Reference signs correspond to those used in FIGS. 1 and 2, with the first digit changed accordingly.

In FIG. 8A, a conductive adhesive 818 is first applied to the card body 822, so that the conductive adhesive 818 is in electrical contact with an antenna 820 in the card body 822. A laminate hot melt 816 is applied to the IC card side of the substrate 804 of the module 850. The module 850 is then implanted into a cavity in the card body 822, such that the conductive adhesive 818 fits into the hole 803, and connects with the routing connection 806 on the contact area 802 side of module 850. The conductive adhesive 818 thus acts as the antenna connector for card 800, as shown in FIG. 8B.

In alternative processes for making the card 800, the conductive adhesive may be deposited into the hole 803, rather than applied to the card body 822, before the card body 822 and card module 850 are connected together. Alternatively, adhesive may be deposited on both the card body 822, and in the hole 803. The adhesive may subsequently be cured.

Figure 9:
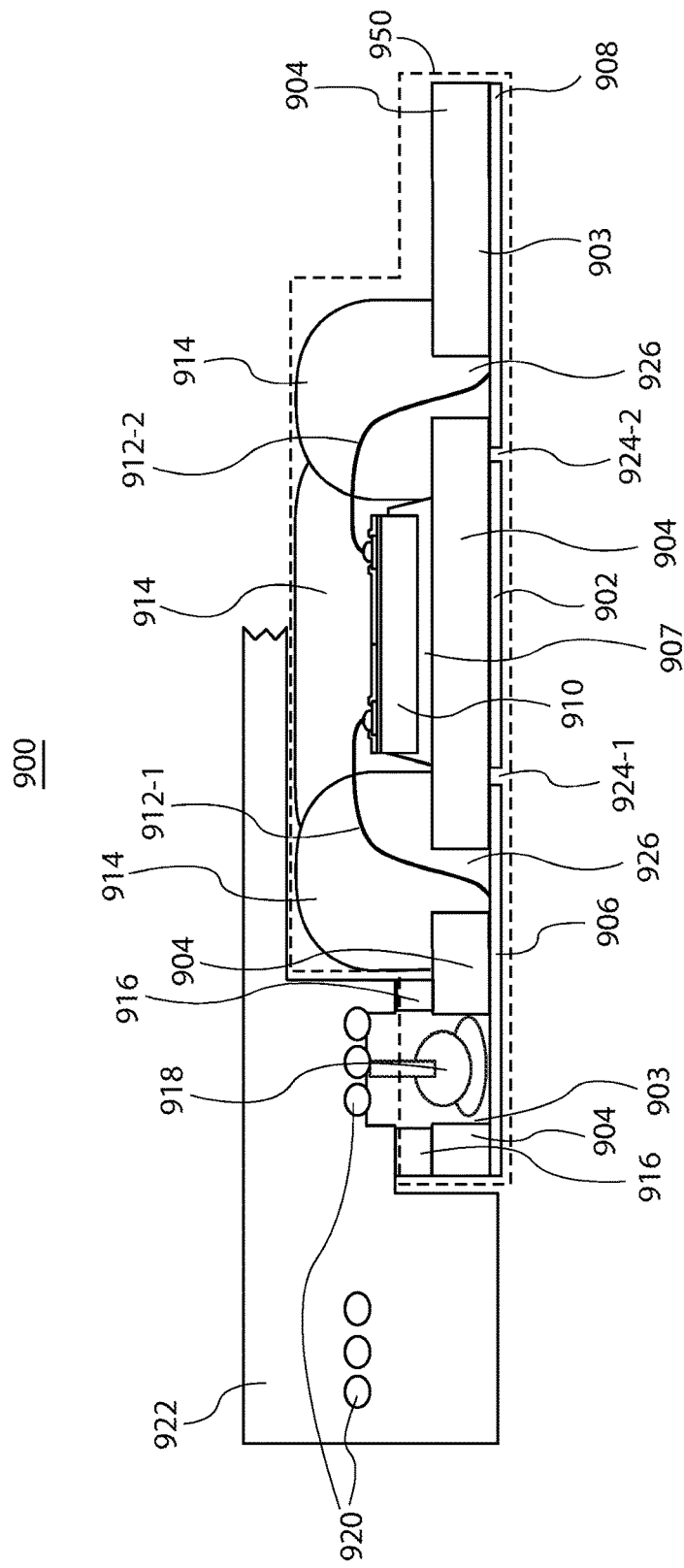
FIG. 9 illustrates a cross-sectional view of a dual-interface IC card in accordance with an alternative example embodiment.

FIG. 9 illustrates an alternative dual-interface IC card 900, in which a stud bump is used as the antenna connector 918. Reference signs correspond with those in FIGS. 1 and 2, with the first digit changed accordingly. As with other embodiments, any other metal or conductive structure may be used as the antenna connector 918, for example a metal plug. The stud bump/conductive structure may for example be connected to the module 950 by conductive adhesive or solder. Alternatively, the stud bump/conductive structure may be welded to the routing connection 906.

Figure 10:
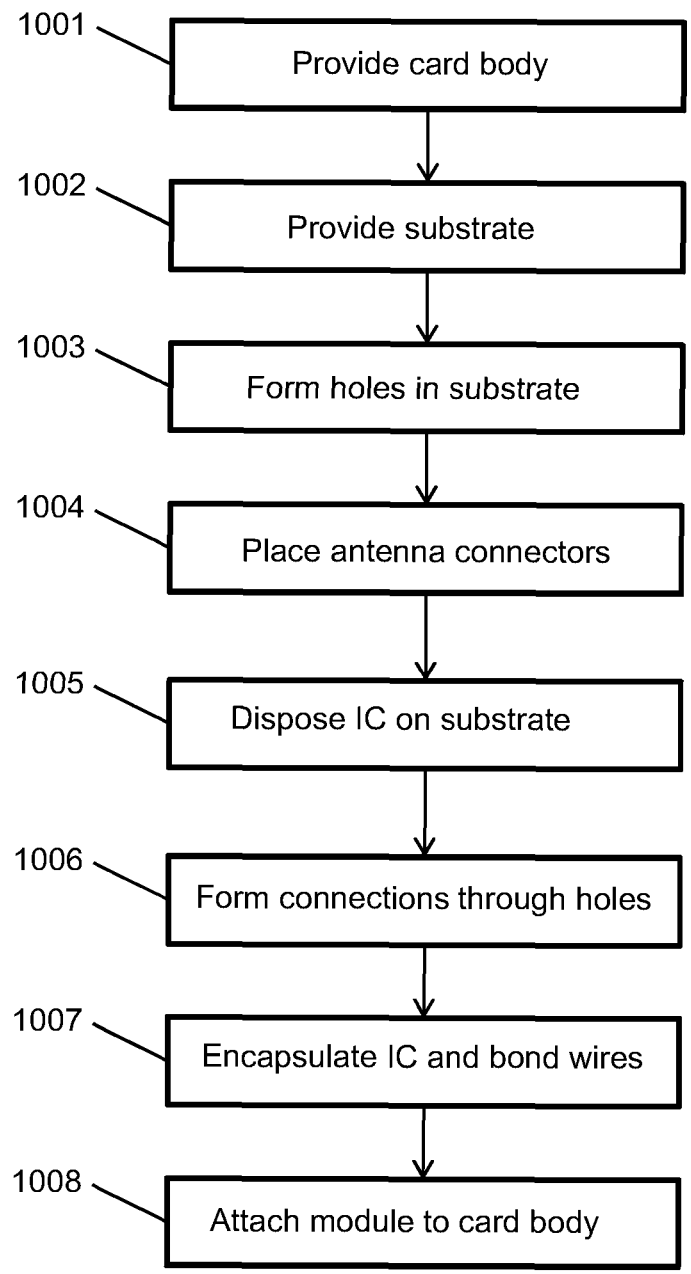
FIG. 10 is a flow diagram of an exemplary method of manufacturing a dual-interface integrated circuit card.

FIG. 10 is a flow diagram illustrating an example embodiment of a manufacturing process for producing a dual-interface integrated circuit card of the type disclosed herein. The method starts at step 1001 with providing a card body containing an antenna, the antenna having first and second antenna connections. At step 1002, a substrate is provided, the substrate having first and second opposing surfaces, with a contact area on the first surface of the substrate, the contact area comprising a plurality of contact pads and first and second routing connections, the first and second routing connections each comprising a first end and a second end. At step 1003 a plurality of holes is formed through the substrate. At step 1004 an antenna connector is placed into first and second ones of the plurality of holes, so that the each antenna connectors is in electrical contact with the second end of the first or second routing connection. At step 1005, an integrated circuit is disposed on the second surface of the substrate. At step 1006, electrical connections are formed through the holes in the substrate to connect the integrated circuit to the plurality of contact pads and to the first and second routing connections. At step 1007 the IC and bond wires are encapsulated for protection. At step 1008, the module is attached to the card body, forming electrical connections between the antenna connections on the card body and the antenna connectors on the module.

Although the operations of the method herein are shown and described in a particular order, the order of the operations of the method may be altered so that certain operations may be performed in a different order or so that certain operations may be performed, at least in part, concurrently with other operations. In another embodiment, instructions or sub-operations of distinct operations may be implemented in an intermittent and/or alternating manner.

From reading the present disclosure, other variations and modifications will be apparent to the skilled person. Such variations and modifications may involve equivalent and other features which are already known in the art of dual-interface cards, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A dual-interface card comprising:
a card body containing an antenna, the antenna having first and second antenna connections; and
a dual-interface integrated circuit card module comprising:
a substrate having first and second opposing surfaces;
a contact area on the first surface of the substrate, the contact area comprising a plurality of contact pads and first and second routing connections each having a first end and a second end;
an integrated circuit on the second surface of the substrate;
electrical connections through the substrate connecting the integrated circuit to the plurality of contact pads and to the first end of each of the first and second routing connections;
first and second antenna connectors disposed in respective first and second holes in the substrate and in electrical contact with the second end of the respective first and second routing connections, the antenna connectors comprising solder; and
a first metal plug placed across the first hole on the second surface of the substrate and a second metal plug placed across the second hole on the second surface of the substrate;
wherein the first and second antenna connectors of the card module are electrically connected to the first and second antenna connections of the card body.

2. The dual-interface card of claim 1, wherein the first and second antenna connectors contact the respective first and second routing connections via the metal plug.

3. The dual-interface card of claim 1, wherein the first and/or second routing connection comprises one of the plurality of contact pads.

4. The dual-interface card of claim 1, wherein each of the antenna connectors form a mechanical bond between the card module and the card body.

5. The dual-interface card of claim 1, further comprising a supplementary connection between each antenna connection of the card body and a respective antenna connector of the card module.

6. The dual-interface card of claim 1, wherein the solder of the first and second antenna connectors connects only the respective routing connection and the metal plug.

7. The dual-interface card of claim 1, wherein the solder of the first and second antenna connectors connects only the respective routing connection and the metal plug without any connection to walls of the first and second holes.

8. A method of manufacturing a dual-interface card, the method comprising:
- providing a card body containing an antenna, the antenna having first and second antenna connections;
- providing a substrate having first and second opposing surfaces, a contact area on the first surface of the substrate comprising a plurality of contact pads and first and second routing connections each having a first end and a second end;
- forming a plurality of holes through the substrate;
- disposing an antenna connector into first and second ones of the plurality of holes, each antenna connector being in electrical contact with the second end of one of the routing connections, wherein disposing an antenna connector into the first and second holes comprises placing solder into each of the first and second holes;
- disposing an integrated circuit on the second surface of the substrate;
- forming electrical connections through the holes in the substrate to connect the integrated circuit to the plurality of contact pads and to the first end of each of the first and second routing connections;
- placing a first metal plug across the first hole and placing a second metal plug across the second hole; and
- attaching the module to the card body, forming electrical connections between the antenna connections on the card body and the antenna connectors on the module by reflowing the solder in the first and second holes.

9. The method of claim 8, wherein disposing an antenna connector into each of the first and second holes comprises placing a ball of solder into each of the first and second holes and reflowing the balls of solder while or before attaching the module to the card body.

10. The method of claim 9, wherein the balls of solder are reflowed such that the solder connects only the respective routing connection and the metal plug.

11. The method of claim 9, wherein the balls of solder are reflowed such that the solder connects only the respective routing connection and the metal plug without any connection to walls of the first and second holes.

12. The method of claim 8, wherein the solder is reflowed such that the solder of the first and second antenna connectors connects only the respective routing connection and the metal plug.

13. The method of claim 8, wherein the solder is reflowed such that the solder of the first and second antenna connectors connects only the respective routing connection and the metal plug without any connection to walls of the first and second holes.

* * * * *